United States Patent [19]
Sakai

[11] Patent Number: 5,894,793
[45] Date of Patent: Apr. 20, 1999

[54] SCREEN PRINTING MACHINE WITH CONTROL MEANS FOR SEPARATING A SCREEN FROM A PRINTING MATERIAL

[75] Inventor: Akira Sakai, Gifu, Japan

[73] Assignee: Sakurai Graphic Systems Corporation, Tokyo, Japan

[21] Appl. No.: 08/942,650

[22] Filed: Oct. 2, 1997

[30] Foreign Application Priority Data

Oct. 7, 1996 [JP] Japan ................................ 8-265933

[51] Int. Cl.$^6$ ........................................ B41F 15/34
[52] U.S. Cl. ........................ 101/123; 101/127.1; 101/129
[58] Field of Search ........................ 101/114, 123, 101/124, 127.1, 129

[56] References Cited

U.S. PATENT DOCUMENTS

| | | | |
|---|---|---|---|
| 4,193,344 | 3/1980 | Ericsson | 101/123 |
| 4,254,707 | 3/1981 | Lambert et al. | 101/123 |
| 4,267,773 | 5/1981 | Scherp et al. | 101/123 |
| 4,413,559 | 11/1983 | Bubley | 101/123 |
| 4,537,126 | 8/1985 | Bubley | 101/123 |
| 4,905,592 | 3/1990 | Sorel | 101/123 |
| 5,176,076 | 1/1993 | Azuma et al. | 101/123 |
| 5,651,309 | 7/1997 | Motev | 101/123 |

FOREIGN PATENT DOCUMENTS

| | | | |
|---|---|---|---|
| 61-14956 | 1/1986 | Japan | 101/123 |

Primary Examiner—Stephen R. Funk
Attorney, Agent, or Firm—Crompton, Seager & Tufte, LLC

[57] ABSTRACT

Disclosed is a screen printing machine which has a first driving mechanism for moving a squeegee movably arranged above a screen along its surface. The printing machine has a second driving mechanism for lifting the screen from a printing material by an upward rotation of its first edge around its second edge. A controller controls the first and second driving mechanisms to operate in association with each other.

11 Claims, 15 Drawing Sheets

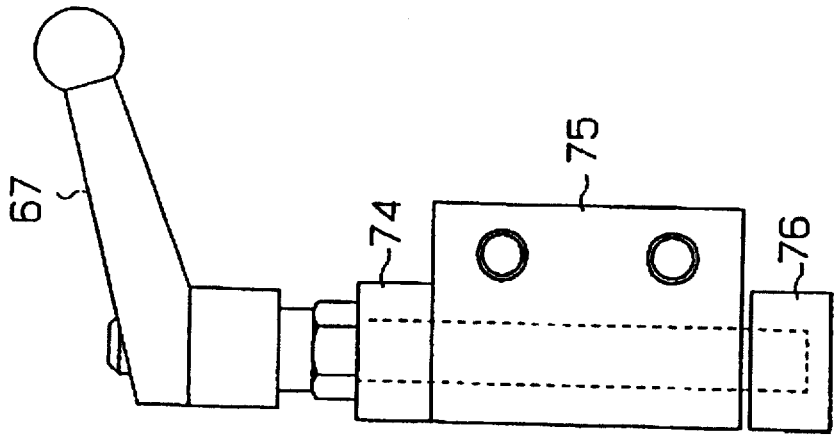
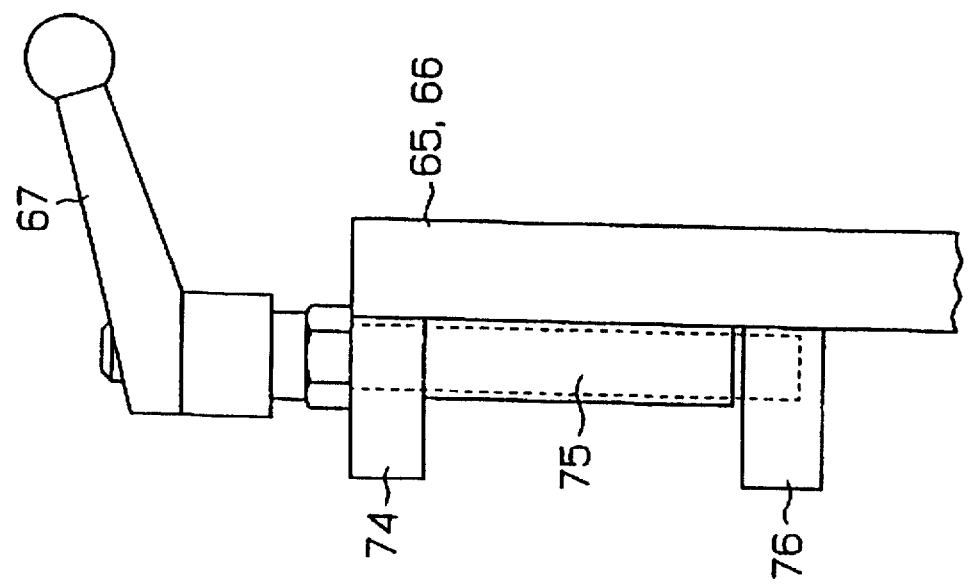

5,894,793

SCREEN PRINTING MACHINE WITH CONTROL MEANS FOR SEPARATING A SCREEN FROM A PRINTING MATERIAL

BACKGROUND OF THE INVENTION

1. Field of the Invention

The present invention relates to a screen printing machine, more specifically to a screen printing machine having excellent pattern forming accuracy.

2. Description of the Related Art

Screen printing machines have conventionally been known as one type of apparatus for printing on plate materials typified by substrates for fabricating printed wiring boards with inks to form print patterns on the substrates. Such type of printing machine is provided with a screen, a squeegee, a driving mechanism for horizontally moving the squeegee, a driving mechanism for achieving screen separation by lifting one side edge of the screen on a fulcrum secured at the opposing side edge, etc. In this printing machine, the squeegee is slid from a printing start side toward a printing end side on the screen on which an ink is loaded to apply the ink onto a plate material mounted on a printing table.

It should be noted here that during the squeegeeing motion, the printing machine also drives a driving mechanism for achieving screen separation to separate the screen from the plate material at the same time. After completion of printing, a scraper is slid from the printing end side toward the printing start side on the screen to scrape the residual ink on the screen back to the printing start side. By repeating the procedures described, a plurality of plate materials are designed to be printed successively.

However, if the squeegeeing motion and the screen separating motion occur with awkward timing, the pressure of the squeegee is concentrated on a certain part of the screen to stretch the screen at such part. If such slackened screen is used, coating films having nonuniform thickness are formed, causing reduction in the pattern forming accuracy.

In order to avoid such inconvenience, it is necessary to properly coordinate the screen separating motion with the squeegeeing motion, more typically to set the screen lifting speed depending on changes in the speed of moving the squeegee and so on.

However, it has been conventionally necessary for an operator to make adjustment of a driving mechanism for driving the squeegee and another driving mechanism for separating the screen independently on his own, requiring intricate and difficult procedures.

SUMMARY OF THE INVENTION

The present invention has been accomplished in view of the circumstances described above, and it is an objective of the present invention to provide a screen printing machine which can minimize slackening of the screen to be caused by squeegeeing without intricate procedures for adjustment.

In order to solve the problems described above, the gist of a first invention is a screen printing machine which comprises a first driving means for moving a squeegee arranged above a screen along a face direction of the screen and a second driving means for separating the screen from a printing material by lifting one side edge of the screen on a fulcrum secured at the opposing side edge, wherein the screen printing machine has control means for coordinating the first and second driving means.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments together with the accompanying drawings in which:

FIG. 11a and FIG. 11b are side views each showing a locking lever;

DETAILED DESCRIPTION OF THE PREFERRED EMBODIMENTS

A screen printing machine 1 of one embodiment of the present invention will be described in detail below by reference to FIG. 1 to FIG. 15.

Figure 1:
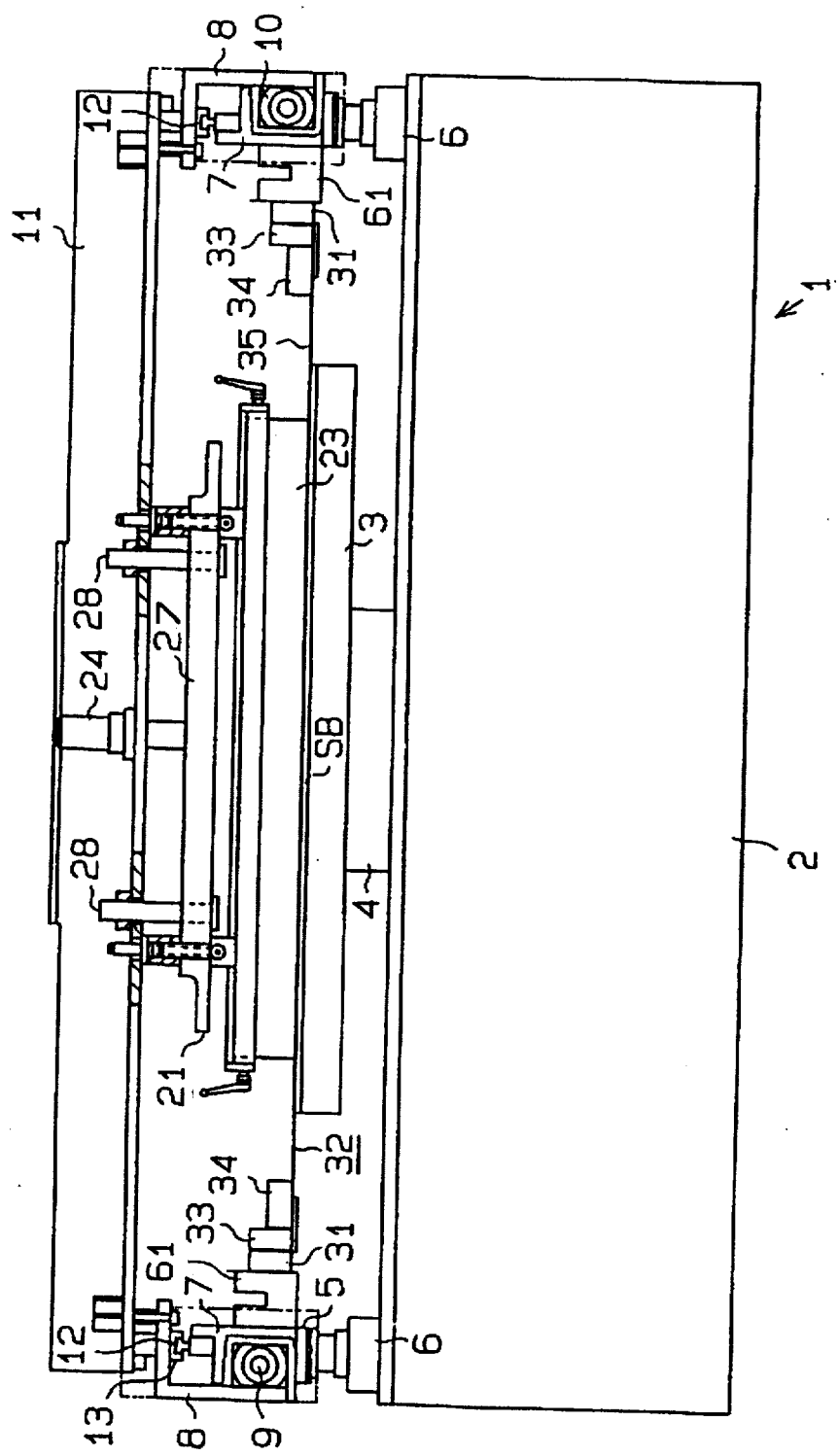
FIG. 1 is a schematic general view showing a screen printing machine in one embodiment of the present invention.

As shown in FIG. 1, at the center portion above a main body 2 constituting the screen printing machine 1 of the embodiment of the present invention, a printing table 3 on which a printing material SB such as a glass substrate and the like is to be mounted is horizontally arranged.

The printing table 3 is provided at the end of a table lifter 4 protruded at the upper center portion of the main body 2 so that the printing table 3 can be elevated (moved upward) and lowered (moved downward) and also can be rotated. On the upper face of the printing table 3, a large number of suction holes (not shown) for fixing the printing material SB by vacuum adsorption are formed.

Figure 2:
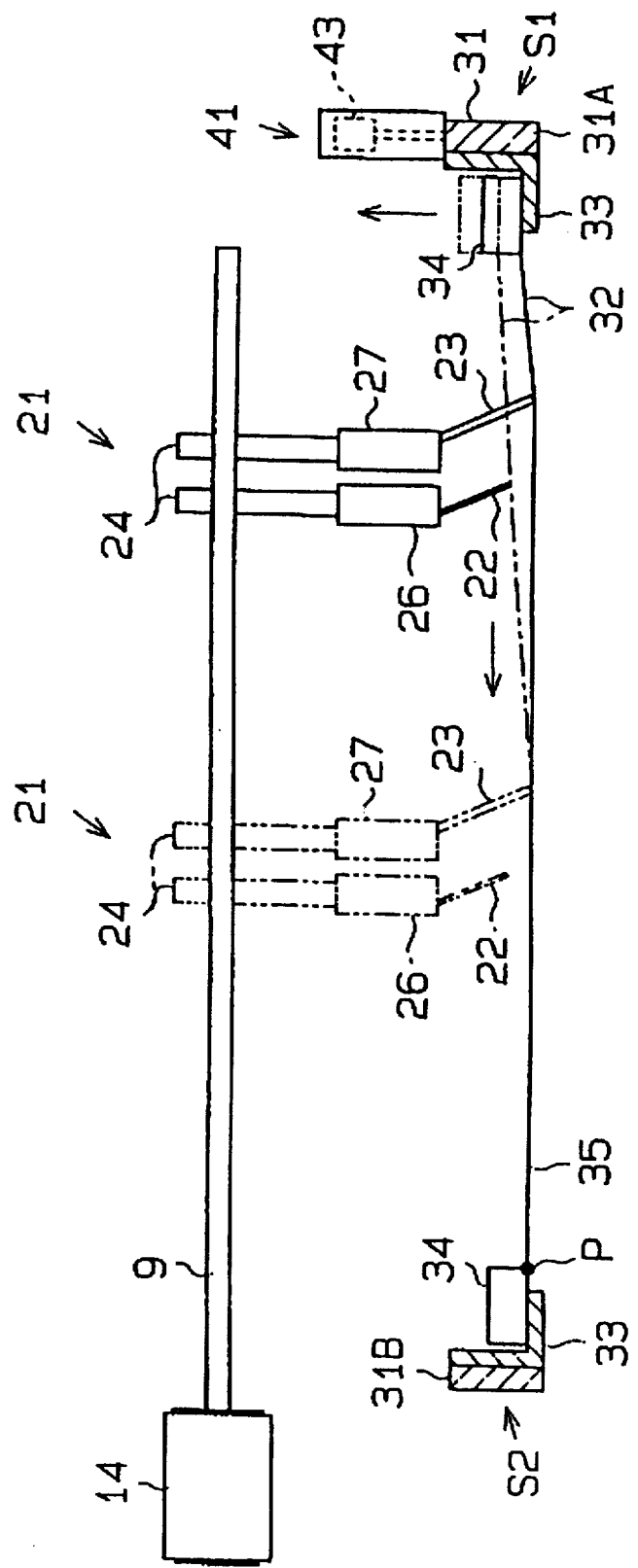
FIG. 2 is a schematic front view for explaining squeegeeing motion and screen separating motion in a screen printing machine.

At both sides of the printing table 3, a plurality of servo motors 6 as actuators for elevation and lowering, which constitute a part of a support 5, are arranged. To the ends of the servo motors 6 extending upward, long supporting frames 7 also constituting a part of the support 5 are fitted along the carrying direction of the printing material SB. The supporting frames 7 have sliding grooves extending along the longitudinal direction. Carrier frames 8 are engaged with the sliding grooves, respectively, and in the grooves, a ball screw 9 and a nut 10 constituting a part of a first driving mechanism are housed, respectively. On the upper faces of a pair of carrier frames 8 provided at the right and left sides, a frame-shaped bracket 11 is horizontally provided. On the upper faces of the supporting frames 7, a guide rail 12 is provided, respectively. On the other hand, at the lower faces of the carrier frames 8, a guided portion 13 slidably engaged with the guide rail 12 is provided, respectively. Therefore, as shown in FIG. 2, when an AC servo motor 14 connecting to the ball screw 9 is driven, the entire bracket 11 moves reciprocatively toward the back and forth directions (i.e., the orthogonal direction of FIG. 1). When the servo motor 6 is expanded or contracted, the entire bracket 11 is designed to be elevated or lowered.

As shown in FIG. 2, below the bracket 11, a movable printer 21 having a squeegee 23, a scraper 22 and so on is provided. At the center portion at the lower face side of the bracket 11, a pair of AC servo motors 24 as driving means are provided side by side with each other in the longitudinal direction and facing downward. To output shafts of the AC servo motors 24, a squeegee holder 27 and a scraper holder 26 are fixed, respectively. The squeegee 23 is fitted to the squeegee holder 27, and the scraper 22 is fitted to the scraper holder 26. Therefore, when the motors 24 are driven, the squeegee 23 and the scraper 22 are designed to be elevated or lowered. At both sides of the fitting position of the AC servo motors 24 in the bracket 11, a pair of guide rods 28 are provided. To the free ends of the guide rods 28, the holders 27 and 26 are fixed, respectively. On the other hand, the fixed ends of the guide rods 28 are designed to be slidable relative to the bracket 11. Therefore, by the guide rods 28, the AC servo motors 24 are designed to be guided perpendicularly when the squeegee 23 and the scraper 22 are elevated or lowered. That is, the movable printer 21 of the embodiment of the present invention are provided with the squeegee 23, the scraper 22, the AC servo motors 24, the squeegee holder 27, the scraper holder 26 and the guide rods 28. The movable printer 21 is designed to be moved reciprocatively toward the back and forth directions together with the bracket 11 by driving the AC servo motor 14 constituting the first driving mechanism.

In a region between the squeegee 23 and the scraper 22, an ink is fed by an ink delivery nozzle (not shown). The nozzle moves reciprocatively toward the back and forth directions independently of the movable printer 21 by another AC servo motor and another ball screw (not shown).

Figure 3:
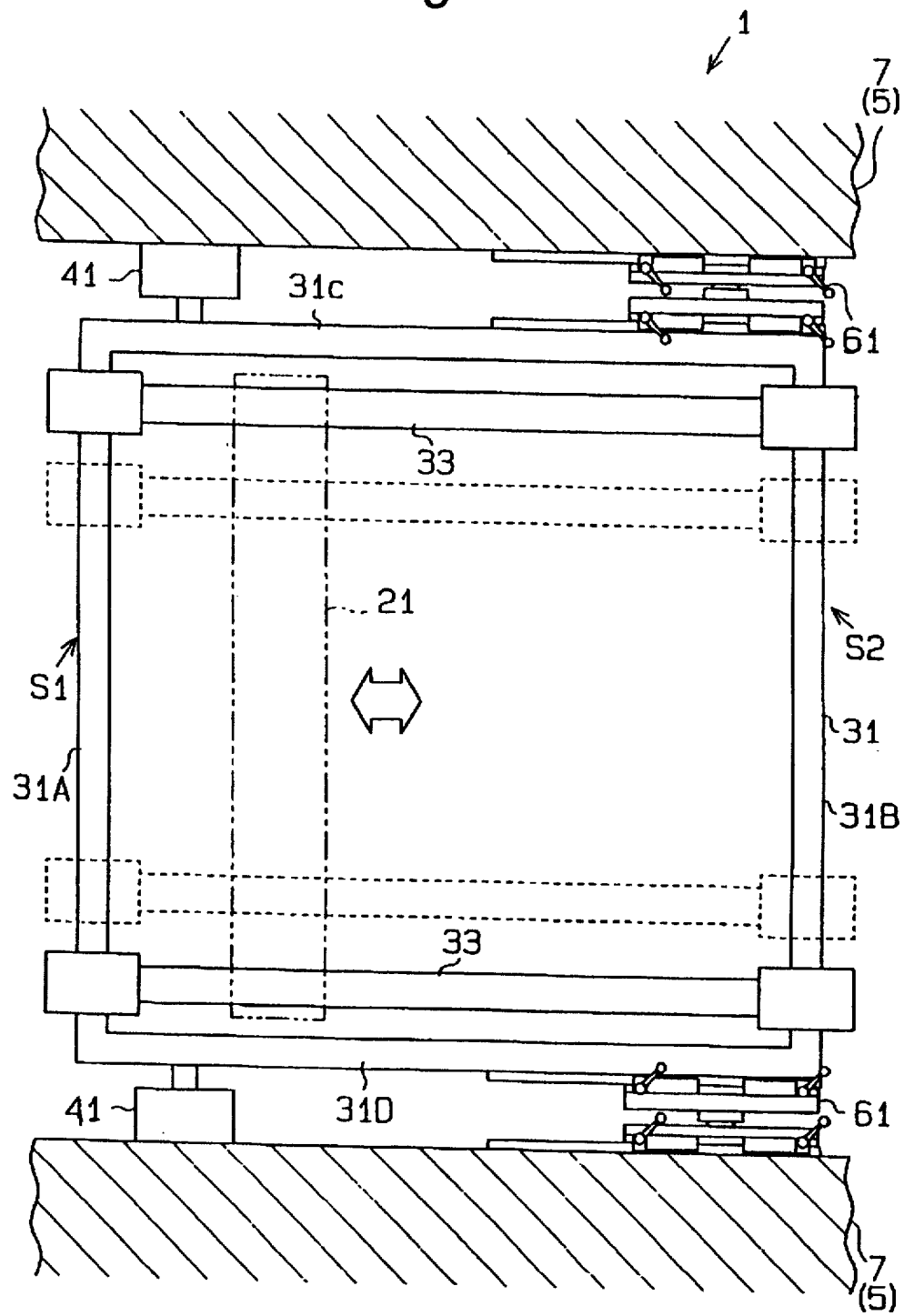
FIG. 3 is a schematic plan view for explaining an arrangement relation of a screen, an auxiliary frame, a support and so on of a screen printing machine.

As shown in FIG. 3, between the movable printer 21 and the printing table 3, a rectangular auxiliary frame 31 having a size larger than that of the printing table 3 is arranged. As shown in FIG. 3, the auxiliary frame 31 is formed by assembling two metal bars 31A and 31B having the same size and two metal bars 31C and 31D having the same size smaller than that of the metal bars 31A and 31B in parallel, respectively. The bars 31C and 31D are arranged in parallel with the moving direction of the movable printer 21 having the squeegee 23, and the bars 31A and 31B are arranged so as to cross perpendicularly to the above moving direction. Hereinafter, the side of the auxiliary frame 31 where the bar 31A exists is referred to as a lifting side edge S1, and the side of the auxiliary frame 31 where the bar 31B exists is referred to as a non-lifting side edge S2.

Figure 4:
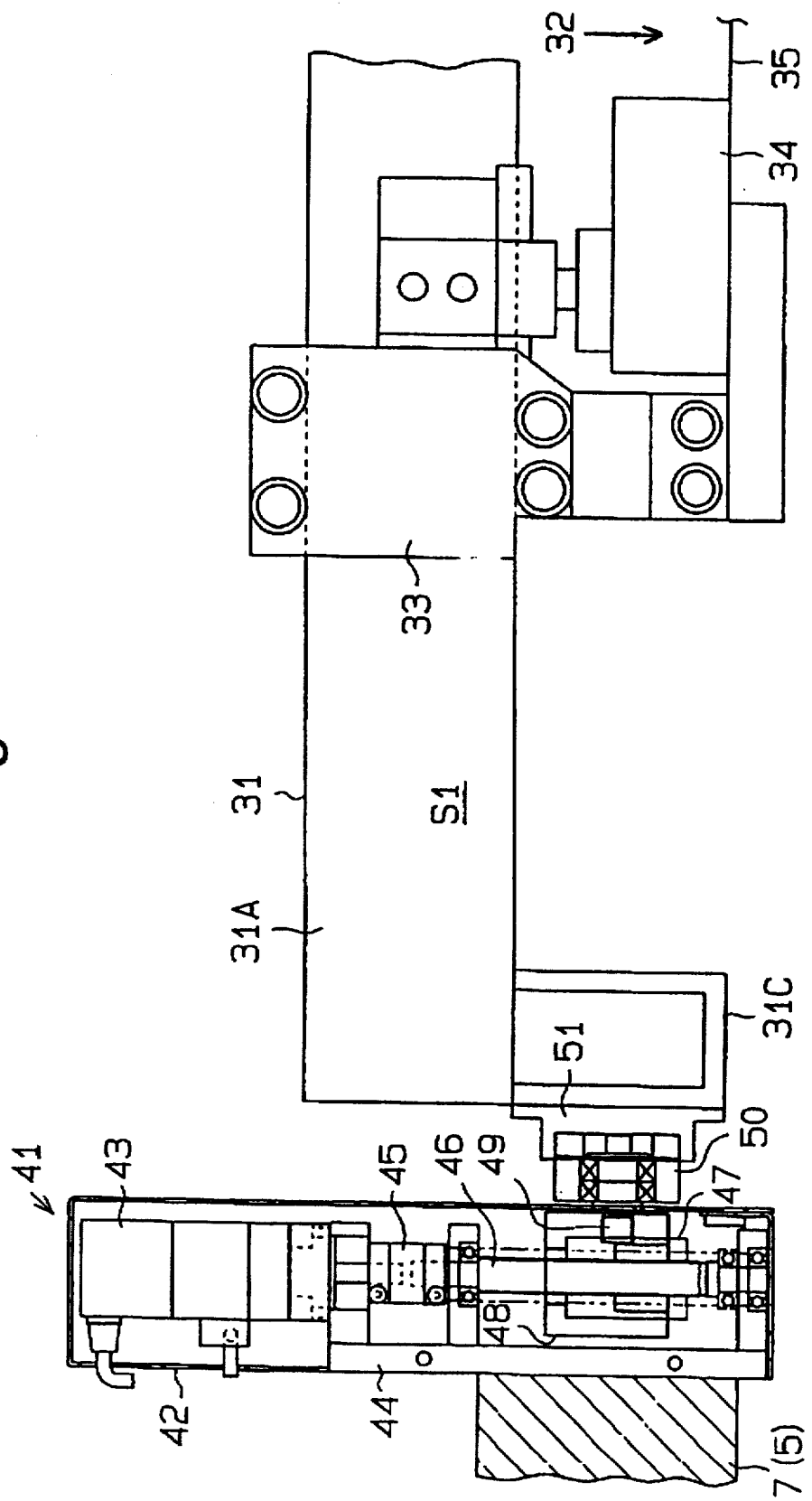
FIG. 4 is a partially broken side view showing the circumference of a position at which a second driving mechanism is installed.

As shown in FIG. 3 and FIG. 4, to the bars 31A and 31B of the auxiliary frame 31, a screen holder 33 for holding a screen frame 34 at the lower face side of the auxiliary frame 31 is fitted, respectively. In order to cope with change in the size of a screen, the distance between the screen holders 33 is adjustable. As shown in FIG. 4, the screen holders 33 hold the screen frame 34 which is a part of a screen 32 in a horizontal state by sandwiching the screen frame 34 from the upper and lower directions. At the lower end side of such a screen frame 34, a rectangular and thin mesh screen 35 to which predetermined masking corresponding to a pattern to be formed is applied. On the surface of the mesh screen 35, a coating film of an emulsion is formed.

Figure 5:
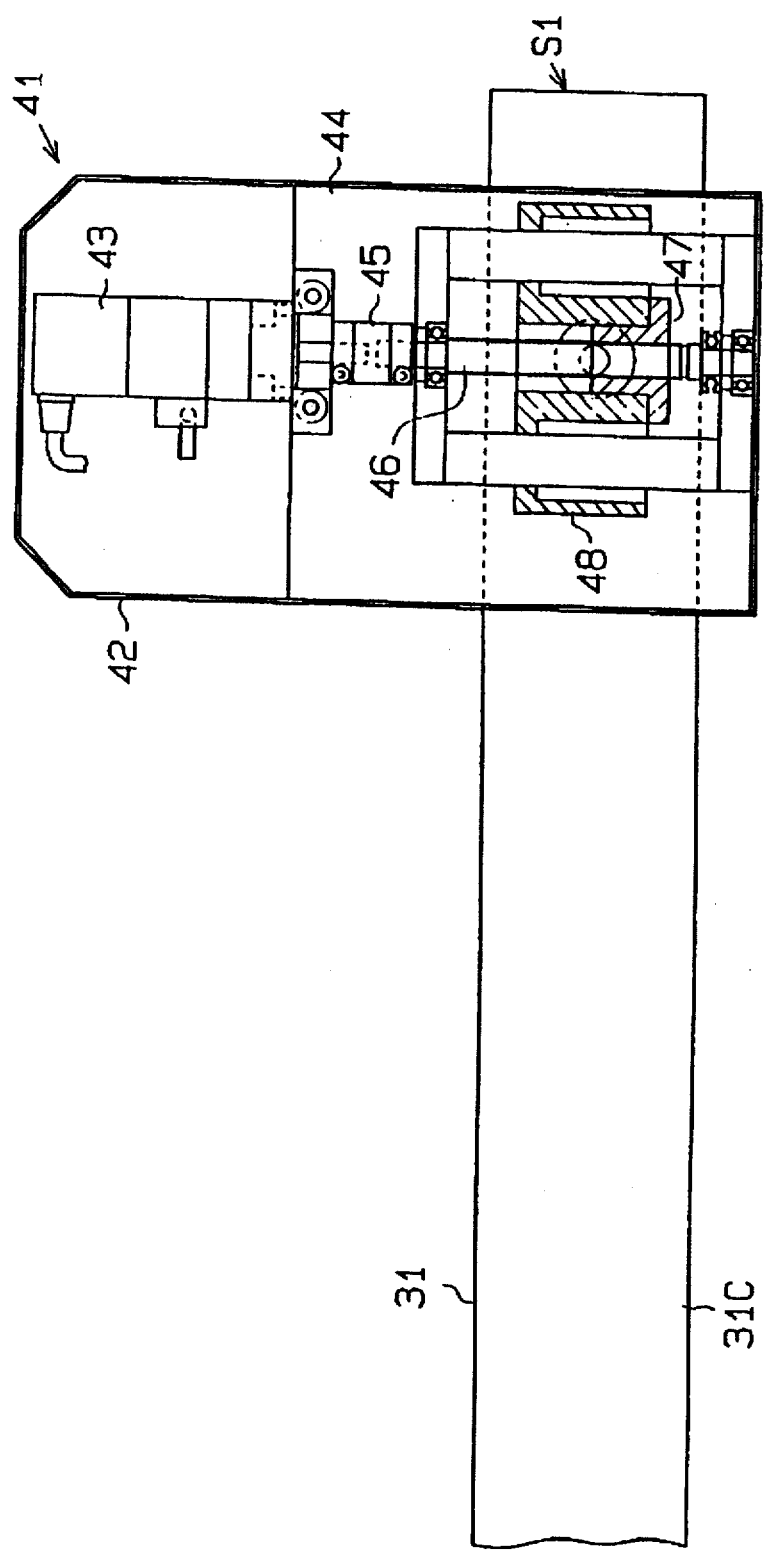
FIG. 5 is a partially broken front view showing the circumference of a position at which a second driving mechanism is installed.

As shown in FIG. 4, to the supporting frame 7, a casing 42 constituting a second driving mechanism 41 is fixed. As shown in FIG. 5 and so on, in the casing 42, an AC servo motor 43, a supporting part 44, a coupling 45, a ball screw 46, a nut 47, a limit switch (not shown), a connecting block 48, a rotatable connecting shaft 49 and so on are housed.

Figure 6:
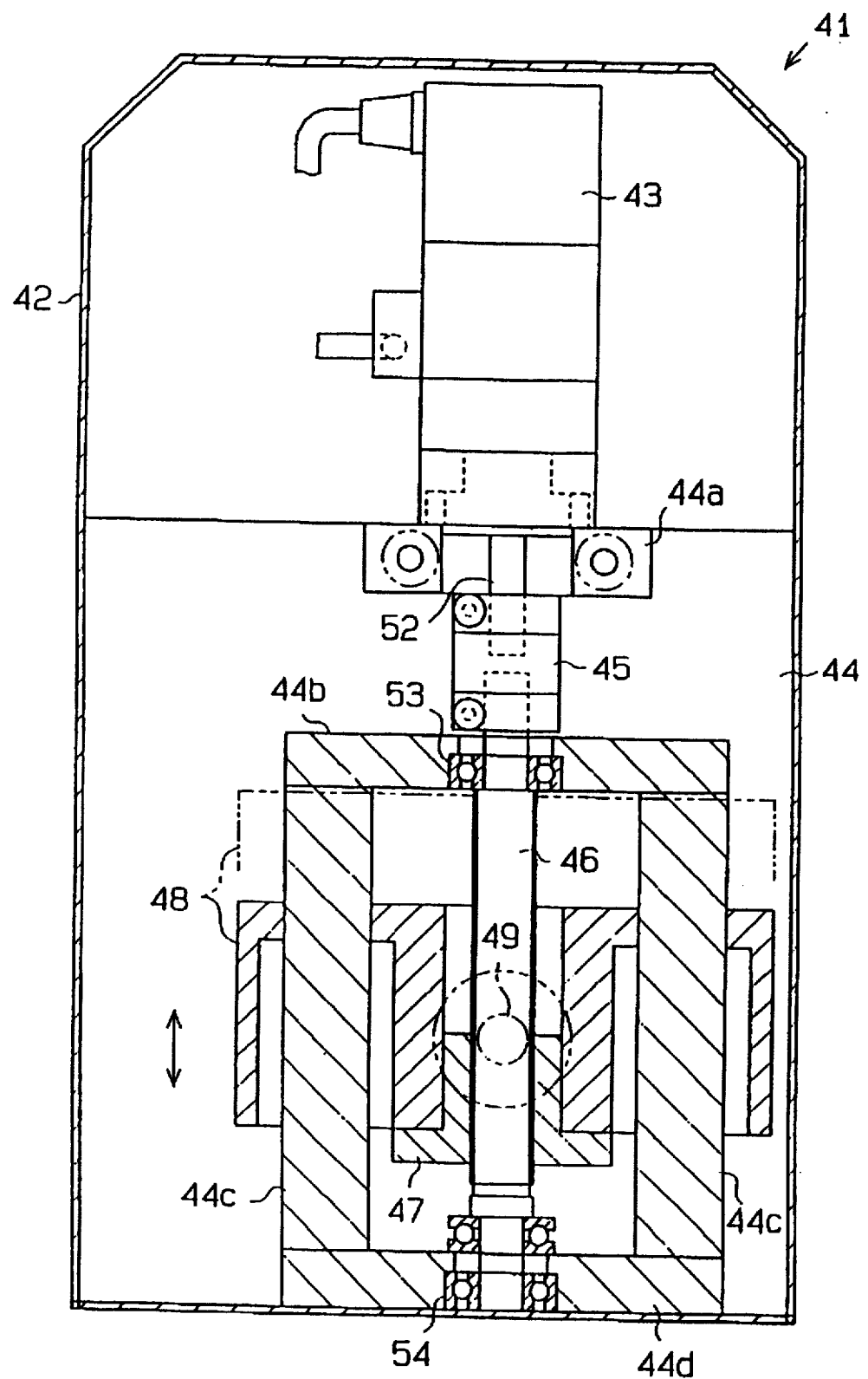
FIG. 6 is an enlarged front cross-sectional view of a second driving mechanism.
Figure 7:
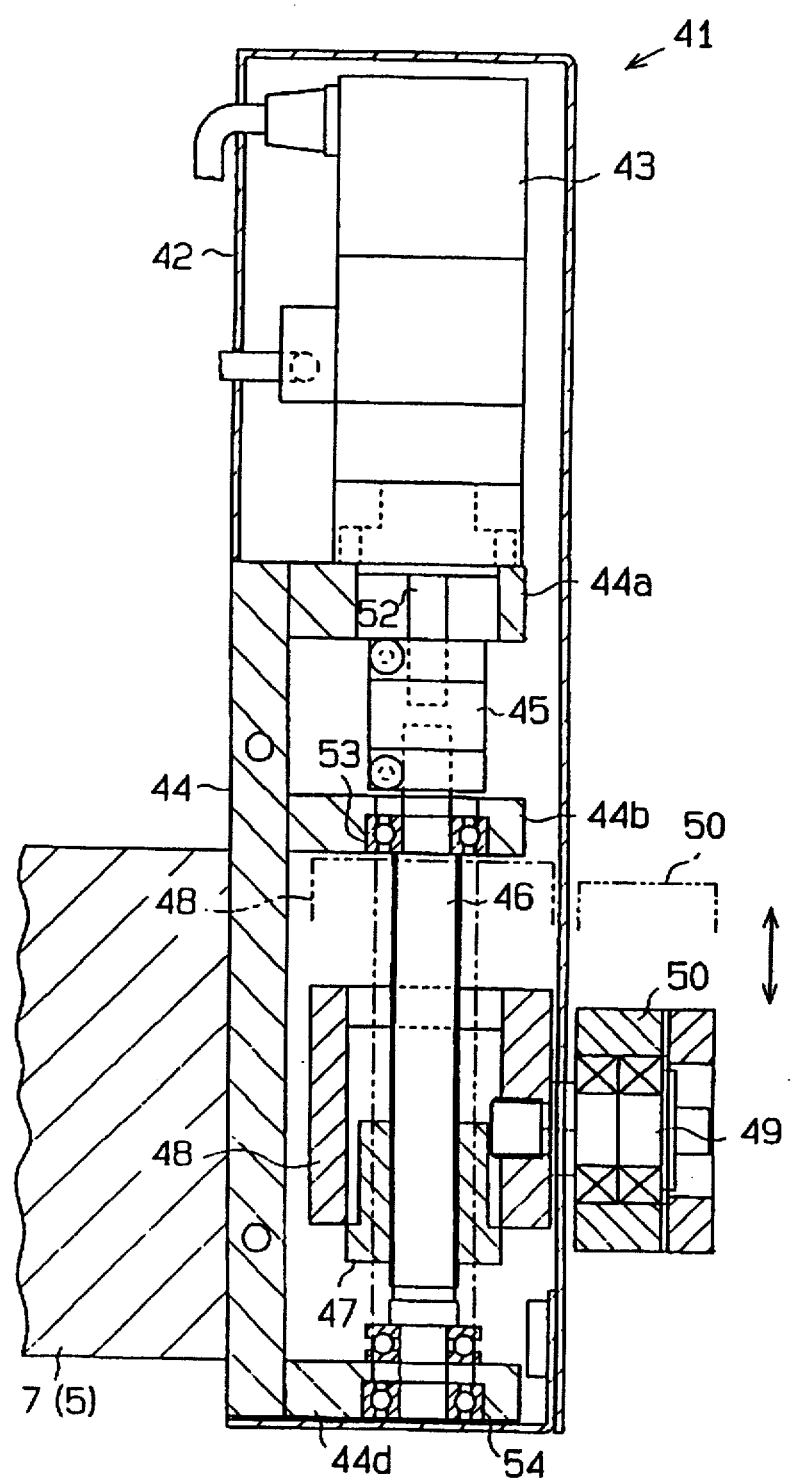
FIG. 7 is an enlarged side cross-sectional view of a second driving mechanism.

As shown in FIG. 6 and FIG. 7, at the upper end portion of the supporting part 44, a motor fixing piece 44a is protruded, and a set of ball screw supporting pieces 44b and 44d are protruded below the motor fixing piece 44a. The AC servo motor 43 is fixed to the upper face of the motor fixing piece 44a, facing downward. The ball screw 46 is connected to a downward protruding output shaft 52 of the motor 43 through the coupling 45. The upper end of the ball screw 46 is rotatably supported relative to a bearing 53 in the upper ball screw supporting piece 44b. On the other hand, the lower end of the ball screw 46 is rotatably supported relative to a bearing 54 in the lower ball screw supporting piece 44d.

As shown in FIG. 6, between the ball screw supporting pieces 44b and 44d, a pair of cylindrical guide rails 44c are provided at the right and left sides. At both ends of the connecting block 48, through holes are formed. The through holes slidably pierce the guide rails 44c. Also, a through hole is formed at the center portion of the connecting block 48, and the nut 47 engaged with the ball screw 46 is fitted thereto. Therefore, when the AC servo motor 43 is rotated, the nut 47 and the connecting block 48 are designed to be elevated or lowered while they are guided by the guide rails 44c. That is, the rotary motion of the motor 43 is converted into linear (reciprocative) motion in the upper and lower directions.

As shown in FIG. 7, at the side face of the connecting block 48, a rotatable connecting shaft 49 is protruded. The protruded end side of the rotatable connecting shaft 49 protruded from the casing 42 is rotatably supported by a bearing 50. As shown in FIG. 4, the outer face of the bearing 50 is connected to a fixing part 51 provided at the side of the auxiliary frame 31. That is, as shown in FIG. 3, the lifting side edge S1 of the auxiliary frame 31 and the screen 32 is indirectly supported by the supporting frame 7 through the second driving mechanism 41. Thus, in FIG. 4, when the AC servo motor 43 is rotated in a predetermined direction, the rotatable connecting shaft 49 and the bearing 50 are moved upward together with the nut 47 and so on. Then, the lifting side edge S1 of the screen is lifted on a fulcrum secured at the non-lifting side edge S2 to gradually separate the screen 32 from the printing material SB.

Next, a variable fulcrum position mechanism 61 provided at the non-lifting side edge S2 of the auxiliary frame 31 will be described by reference to FIG. 8 to FIG. 14.

Figure 10:
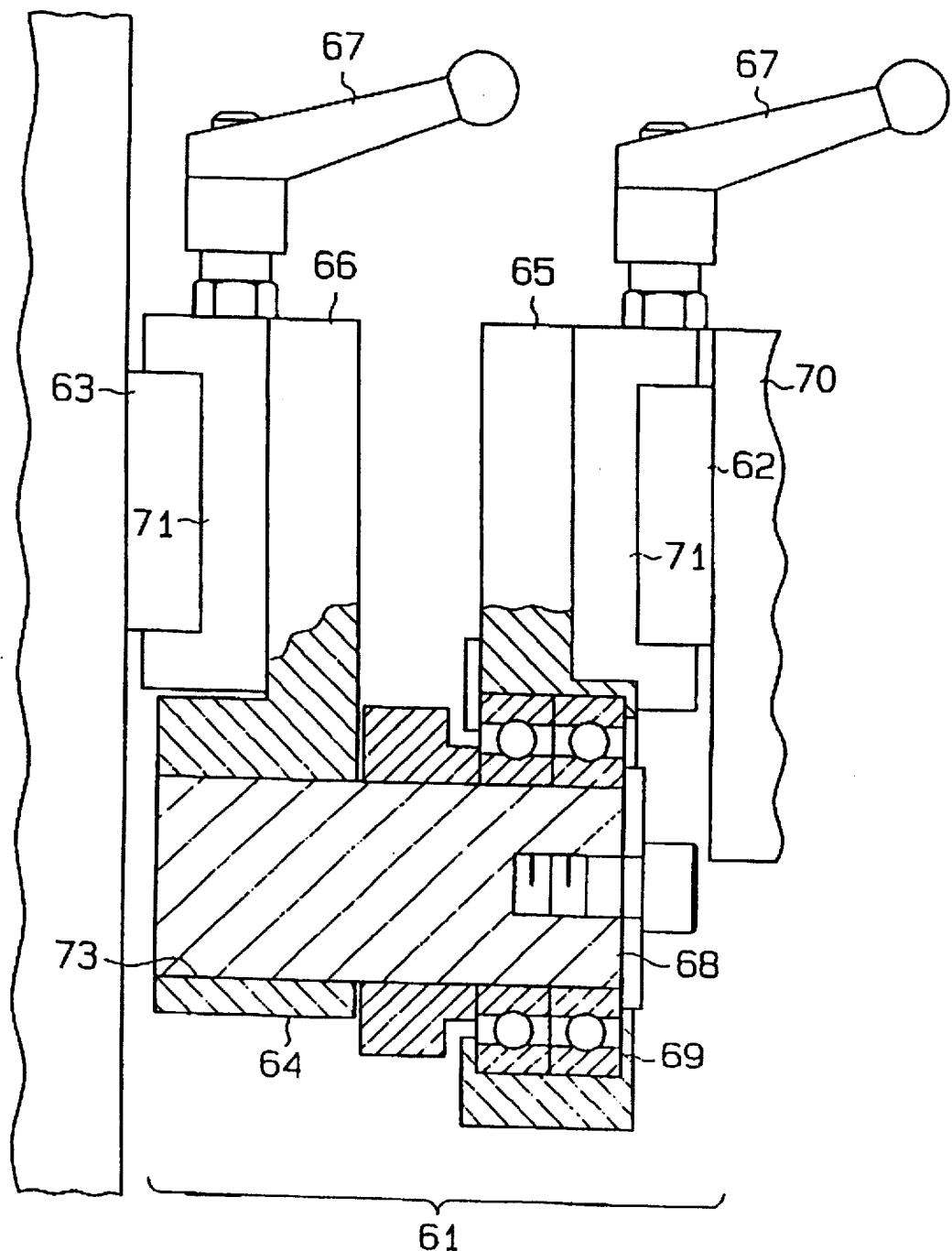
FIG. 10 is an enlarged side cross-sectional view of a variable fulcrum position mechanism.

As shown in FIG. 10 and so on, roughly speaking, the variable fulcrum position mechanism 61 of the embodiment of the present invention is provided with first and second guide rails 62 and 63 as first and second guide members and a connector 64 having an engaging portion to be slidably engaged with the guide rails 62 and 63. In the embodiment of the present invention, the connector 64 is constituted by first and second engaging plates 65 and 66, locking levers 67 as fixing tools, a connecting shaft 68, a bearing 69 and so on.

Figure 8:
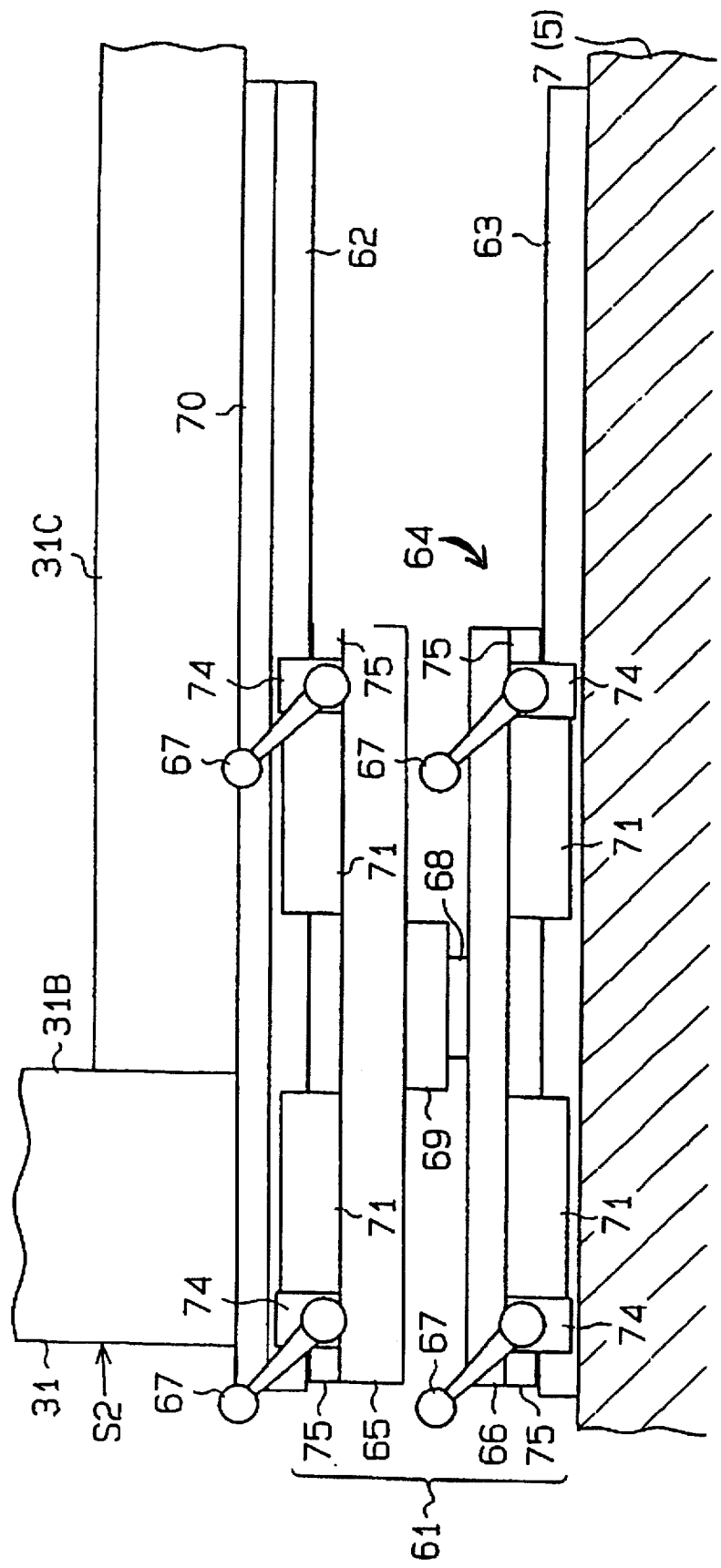
FIG. 8 is a partial plan view showing the circumference of a position at which a variable fulcrum position mechanism is installed.
Figure 9:
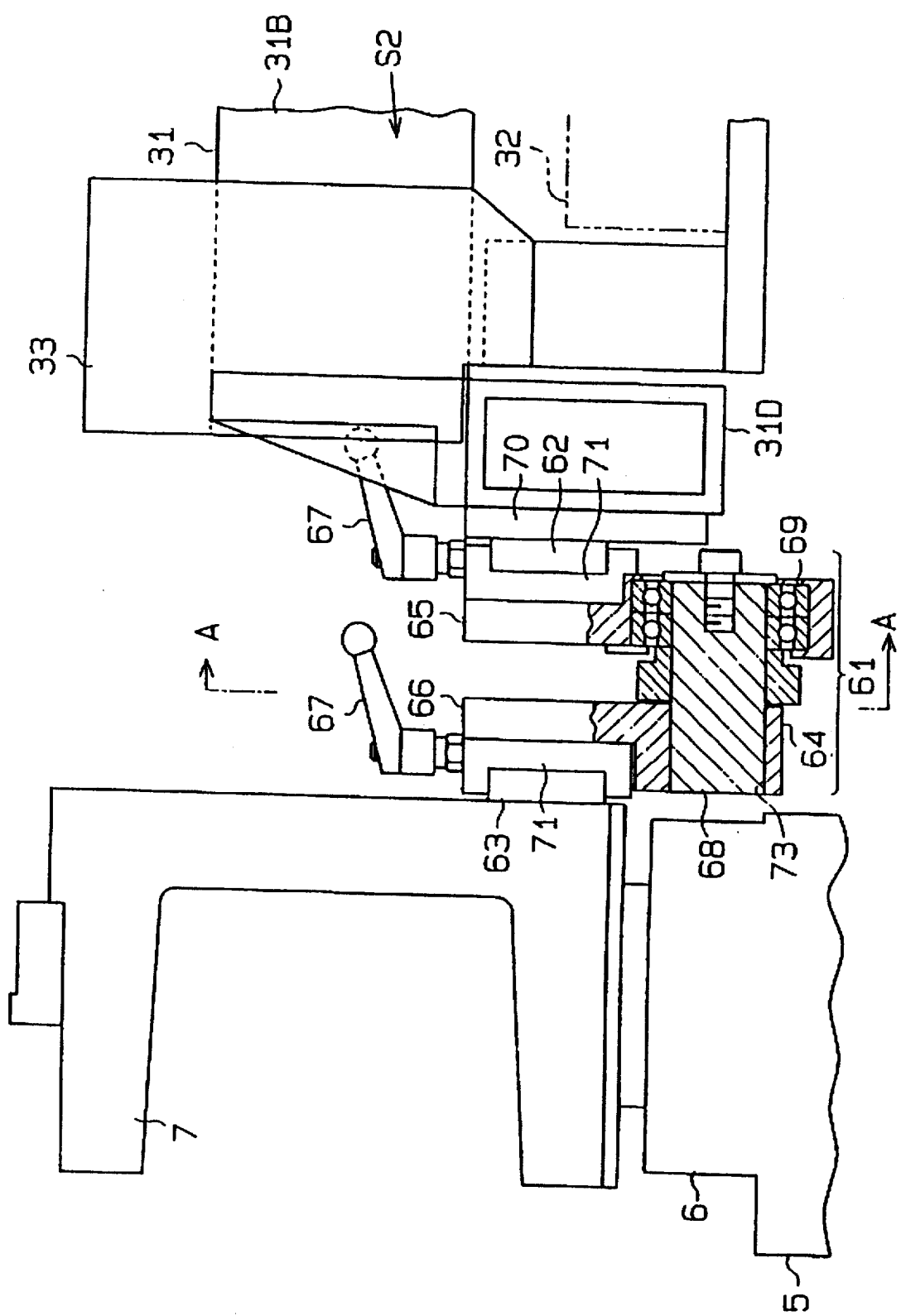
FIG. 9 is a partial side view showing the circumference of a position at which a variable fulcrum position mechanism is installed.

As shown in FIG. 8 to FIG. 10, the first guide rail 62 which is a rectangular metal member is fixed to the non-lifting edge side S2 of the bars 31C and 31D constituting the auxiliary frame 31 through a fitting plate 70. The second guide rail 63 which is also a rectangular metal member is directly and horizontally provided relative to the inner face of the supporting frame 7. The guide rails 62 and 63 are positioned so as to be opposed to each other, and extend toward the moving direction of the movable printer 21.

Figure 12:
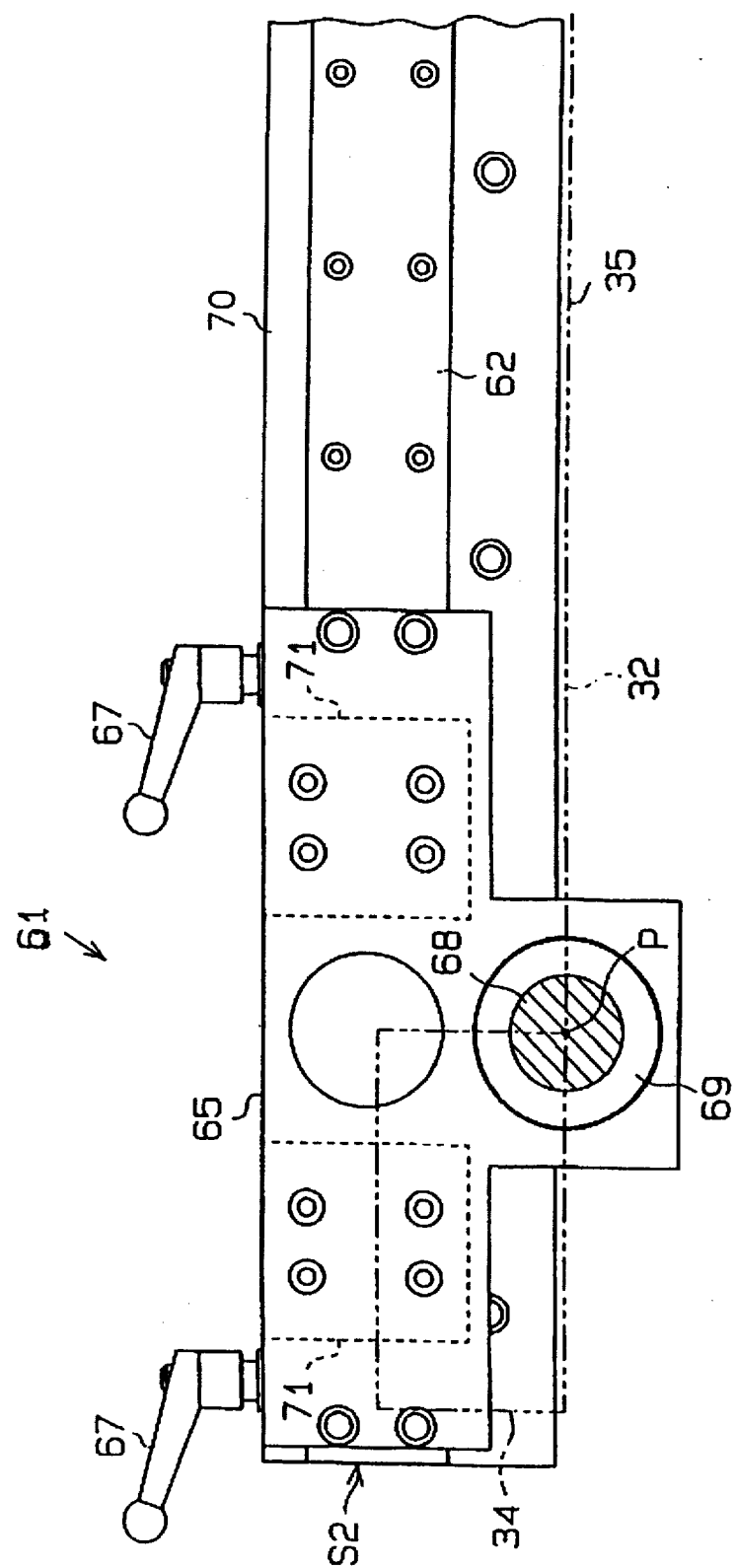
FIG. 12 is a cross-sectional view along line A—A of FIG. 9 when a large-sized screen is used.

The first engaging plate 65 constituting the connector 64 is a substantially T-shaped metal member as shown in FIG. 12. To one side of the first engaging plate 65, a pair of sliding blocks 71 as engaging portions are fixed at a predetermined interval. The sliding blocks 71 are slidably engaged with the first guide rail 62.

The second engaging plate 66 which is a metal member is arranged so as to be opposed to the first engaging plate 65. Also, to one side of the second engaging plate 66, a pair of sliding blocks 71 as engaging portions are fixed at a predetermined interval. The sliding blocks 71 are slidably engaged with the second guide rail 63.

As shown in FIG. 9 and FIG. 10, into an insertion hole 73 provided nearly at the center of gravity of the second engaging plate 66, one end of the connecting shaft 68 is non-rotatably inserted. The other end of the connecting shaft 68 is rotatably supported by the bearing 69 provided nearly at the center of gravity of the first engaging plate 65. Therefore, by the connecting shaft 68, the engaging plates 65 and 66, i.e., the side of the auxiliary frame 31 and the side of the supporting frame 7 are connected. The connecting shaft 68 serves as a fulcrum P of rotation at the time of the lifting motion.

As shown in FIG. 11 and so on, to both ends of the engaging plates 65 and 66 at the upper face sides of the guide rails 62 and 63, an upper gripping piece 74 having a screw hole is fixed, respectively. Into the screw hole of the upper gripping piece 74, the locking lever 67 is screwed from an upper portion. The end of a screw of the locking lever 67 pierces a spacer 75, is protruded at the lower face side thereof and is screwed into a screw hole of a lower gripping piece 76 at the lower face side of the guide rail 62 or 63. Therefore, when the locking levers 67 are rotated clockwise, the gripping pieces 74 and 76 hold the guide rails 62 and 63 by sandwiching the guide rails 62 and 63 from the upper and lower directions. Thus, the engaging plates 65 and 66 are made non-slidable relative to the guide rails 62 and 63 to determine the position of the fulcrum P of the lifting motion. When the locking levers 67 are rotated counterclockwise, the guide rails 62 and 63 are released, and the engaging plates 65 and 66 are slidable relative to the guide rails 62 and 63. The position of the fulcrum P at the time of the lifting motion becomes optimum when it is set so as to coincide with a position near the interface of the non-lifting side edge S2 of the screen 32, the screen frame 34 and the mesh screen 35. It has been known that when the position of the fulcrum P is set as described above, slackening of the screen 32 can be minimized without making adjustment of a screen separating amount.

Figure 13:
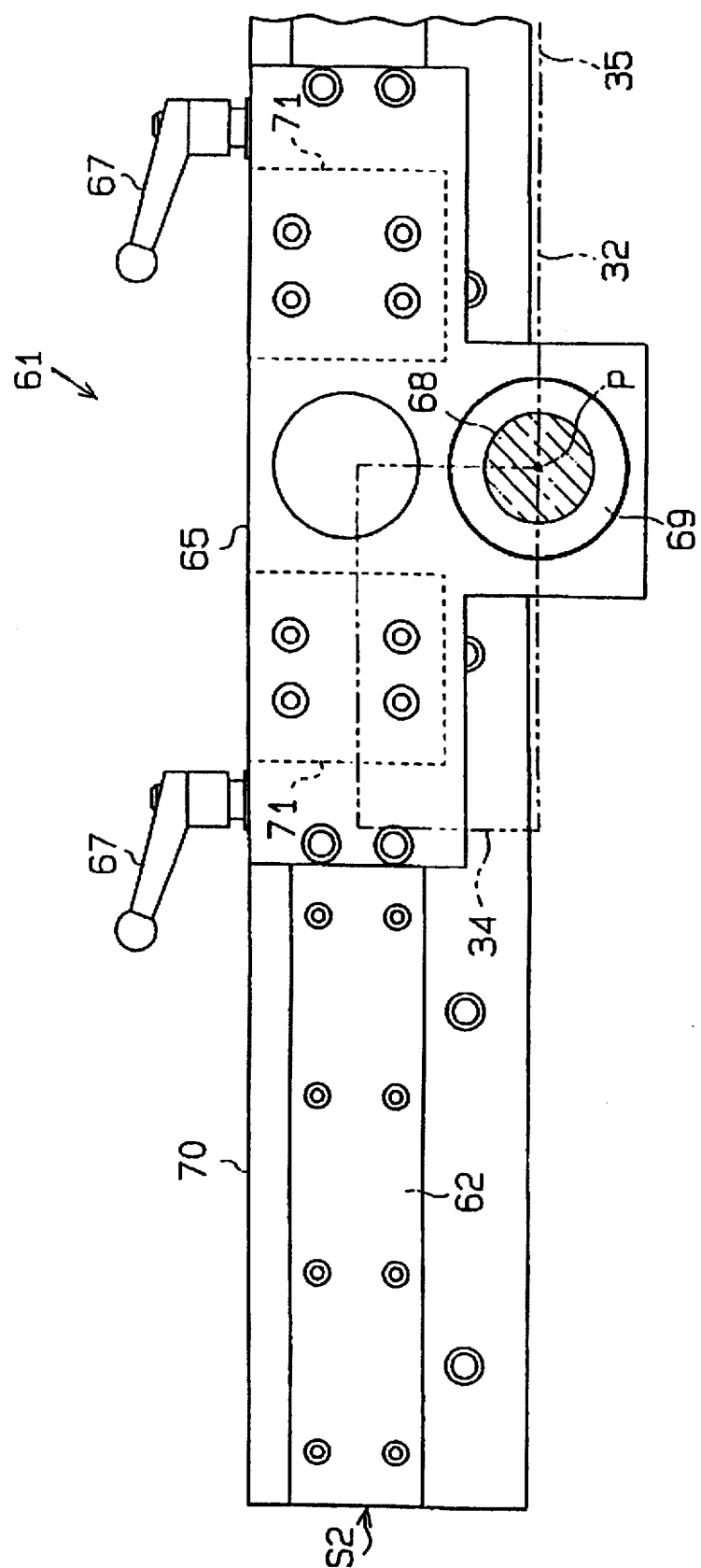
FIG. 13 is a cross-sectional view along line A—A of FIG. 9 when a small-sized screen is used.
Figure 14A:
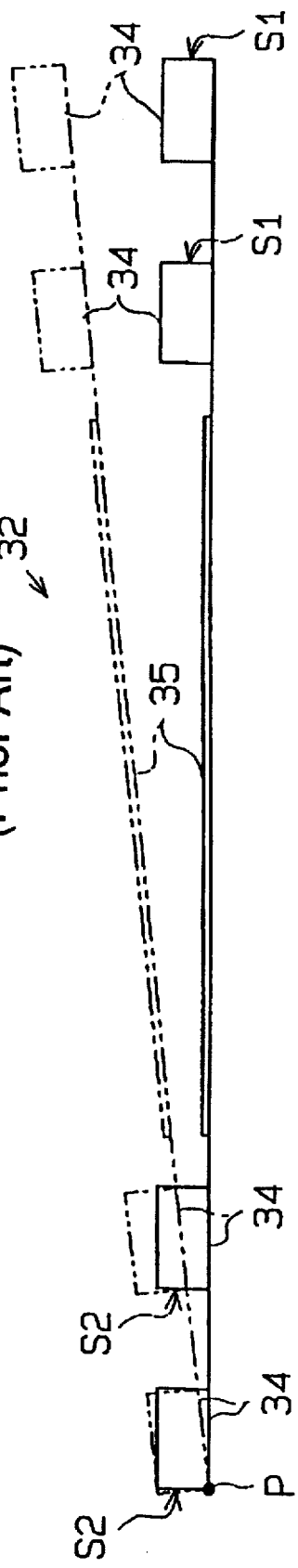
FIG. 14a is a schematic view showing a rotary fulcrum position of a screen in a conventional embodiment.
Figure 14B:
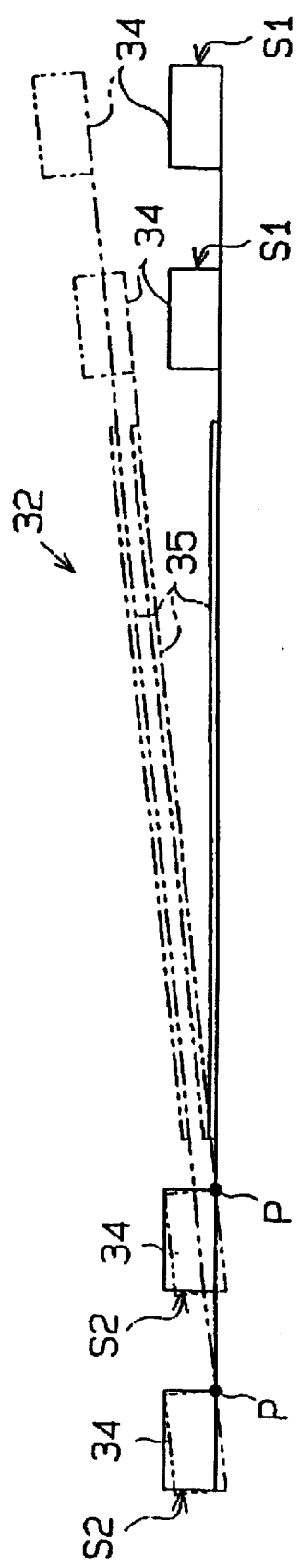
FIG. 14b is a schematic view showing a rotary fulcrum position of a screen in the embodiment of the present invention.

When screens 32 having different sizes are used, the following procedures for adjustment are carried out (see FIG. 12 and FIG. 13).

FIG. 12 shows a state when a large-sized screen 32 is used. The first and second engaging plates 65 and 66 are positioned at the leftmost side, i.e., at the side of the non-lifting side edge S2. The center of the connecting shaft 68 which serves as the rotation fulcrum P at the time of the lifting motion is set at a position near the interface of the screen frame 34 and the mesh screen 35 (i.e., at the optimum position). Here, when a small-sized screen 32 is used, the position near the interface of the screen frame 34 and the mesh screen 35 is slightly shifted toward the right side, i.e., the side of the lifting side edge S1. Therefore, in that case, as shown in FIG. 13, the center of the connecting shaft 68 may be changed to the new optimum position by shifting the engaging positions of the engaging plates 65 and 66 toward the lifting side edge S1.

Next, an interlocking controller for controlling the AC servo motors 14 and 43 constituting the first driving mechanism and the second driving mechanism 41 will be described.

The screen printing machine 1 is provided with a computer (not shown). The computer is provided with a central processing unit (CPU) as the interlocking controller. The CPU has a memory as a memory mechanism. In the memory, a plurality of moving speed changing pattern data D1 to D4 and a plurality of lifting speed changing pattern data D5 to D8 have previously been held. In FIG. 15, the respective four graphs of two kinds of data are shown for convenience.

The moving speed changing pattern data D1 to D4 shown in FIG. 15a to FIG. 15d will be briefly described. The data D1 to D4 are data of patterns showing change in the moving speed VS of the movable printer 21 with the lapse of time at the time of driving the AC servo motor 14. In the graphs, each axis of ordinates shows a moving speed (VS), and each axis abscissas shows a time (t). The moving speed VS is in proportion to the number of rotations of the AC servo motor 14. It is preferred that a plurality of the moving speed changing pattern data D1 to D4 are prepared for each of various screen sizes which might be used.

Figure 15A:
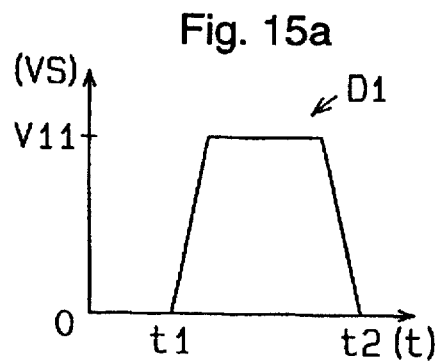
FIG. 15a to FIG. 15h are graphs each showing a lifting speed changing pattern and a moving speed changing pattern.

In the datum D1 of FIG. 15a, the moving speed VS of the movable printer 21 is linearly increased after t1, becomes constant (VS=V11) and then is linearly decreased. When t is t2, VS becomes 0. In the datum D1, the increasing rate and the decreasing rate of the moving speed VS are equal to each other.

Figure 15E:
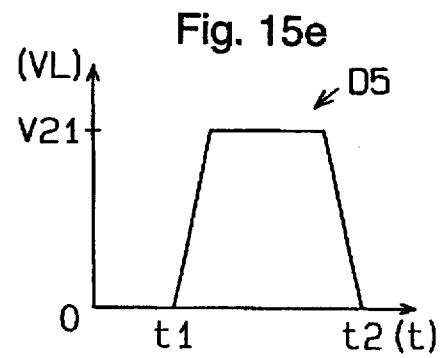
Figure 15B:
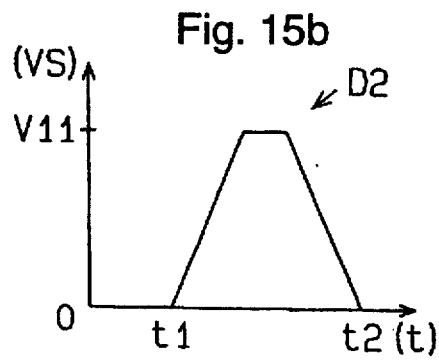

In the datum D2 of FIG. 15b, the moving speed VS of the movable printer 21 is linearly increased after t1, becomes constant (VS=V11) and then is linearly decreased similarly as in the datum D1. When t is t2, VS becomes 0. In the datum D2, the increasing rate and the decreasing rate of the moving speed VS are equal to each other, but inclinations thereof are smaller than those of the datum D1. Therefore, in the datum D2, the length of the constant speed region is relatively short.

Figure 15F:
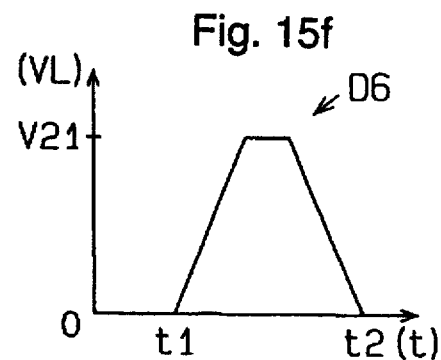
Figure 15C:
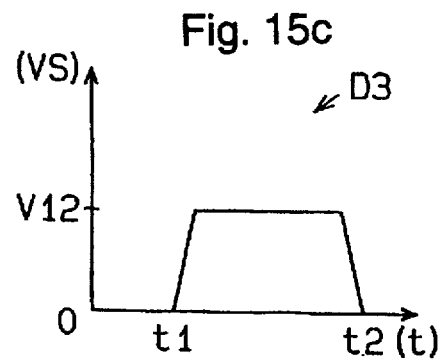
Figure 15G:
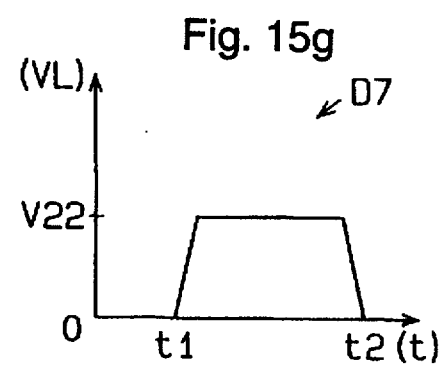

In the datum D3 of FIG. 15c, the moving speed VS of the movable printer 21 is linearly increased after t1, becomes constant and then is linearly decreased similarly as in the datum D1. When t is t2, VS becomes 0. The increasing rate and the decreasing rate of the moving speed VS are equal to each other. However, the datum D3 is different from the datum D1 in that the moving speed VS becomes constant at V12 which is a value lower than V11.

Figure 15D:
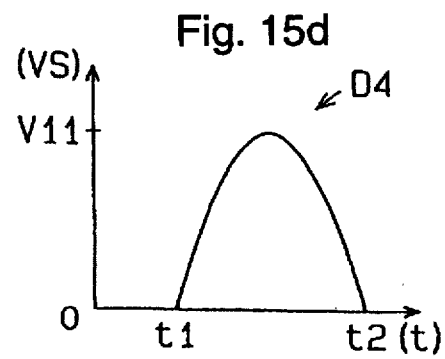

In the datum D4 of FIG. 15d, the moving speed vs of the movable printer 21 is changed as shown by a substantially sine curve-shaped curve, which is different from the data D1 to D3. That is, the moving speed VS is smoothly increased after t1, and after the moving speed VS reaches the highest value (VS=V11), it is smoothly decreased. When t is t2, VS becomes 0.

Next, the lifting speed changing pattern data D5 to D8 shown in FIG. 15e to FIG. 15h will be briefly described. The data D5 to D8 are data of patterns showing change in the lifting speed VL of the connecting block 48 (the lifting side edge S1 of the screen 32) with the lapse of time at the time of driving the AC servo motor 43. In the graphs, each axis of ordinates shows a lifting speed (VL), and each axis abscissas shows a time (t). The lifting speed VL is in proportion to the number of rotation of the AC servo motor 43.

In the datum D5 of FIG. 15e, the lifting speed VL is linearly increased after t1, becomes constant (VL=V21) and then is linearly decreased. When t is t2, VL becomes 0. In the datum D5, the increasing rate and the decreasing rate of the lifting speed VL are equal to each other.

In the datum D6 of FIG. 15f, the lifting speed VL is linearly increased after t1, becomes constant (VL=V21) and then is linearly decreased similarly as in the datum D5. When t is t2, VL becomes 0. In the datum D6, the increasing rate and the decreasing rate of the lifting speed VL are equal to each other, but inclinations thereof are smaller than those of the datum D5. Therefore, in the datum D6, the length of the constant speed region is relatively short. In the datum D7 of FIG. 15g, the lifting speed VL is linearly increased after t1, becomes constant and then is linearly decreased similarly as in the datum D5. When t is t2, VL becomes 0. The increasing rate and the decreasing rate of the lifting speed VL are equal to each other. However, the datum D7 is different from the datum D5 in that the lifting speed VL becomes constant at V22 which is a value lower than V21.

Figure 15H:
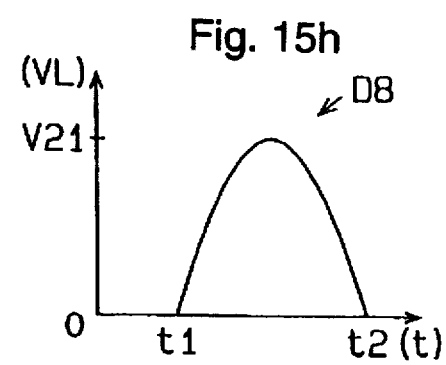

In the datum D8 of FIG. 15h, the lifting speed VL is changed as shown by a substantially sine curve-shaped curve, which is different from the data D5 to D7. That is, the lifting speed VL is smoothly increased after t1, and after the lifting speed VL reaches the highest value (VL=V21), it is smoothly decreased. When t is t2, VL becomes 0.

In the embodiment of the present invention, the CPU controls the AC servo motors 14 and 43 based on a plurality of the data D1 to D8 described above. This mechanism will be specifically described below. The CPU selects only one datum (for example, D1) from the group of the moving speed changing pattern data D1 to D4. Then, in order to move the movable printer 21 according to the profile of the datum D1, the CPU outputs a predetermined controlling signal for that purpose to the AC servo motor 14. At that time, the CPU accesses the group of the lifting speed changing pattern data D5 to D8 from the memory and selects one optimum datum for the datum D1 therefrom. In this case, the datum D5 is selected from the group of the four data D5 to D8 since the profile of D5 is the most approximate to that of the datum D1. In order to carry out the lifting motion according to the profile of the datum D5, the CPU outputs a predetermined controlling signal for that purpose to the AC servo motor 43. As a result, interlocking control for coordinating the motors 14 and 43 is achieved. Similarly, as the optimum datum, the datum D6 is selected when the datum D2 is selected, the datum D7 is selected when the datum D3 is selected, and the datum D8 is selected when the datum D4 is selected, respectively.

Next, a series of motions of the screen printing machine 1 will be described.

First, the screen 32 having a predetermined size is set to the auxiliary frame 31, and the screen 32 and the printing table 3 are brought close to each other to superpose the screen 32 on the printing table 3. In such an initial state, the movable printer 21 is positioned at the lifting side edge S1. An ink is previously fed in front of the squeegee 23, and only the squeegee 23 is moved downward by driving the AC servo motor 24 to be brought into contact with the screen 32. Next, by driving the AC servo motor 14 according to a previously selected datum (for example, D1), the movable printer 21 is horizontally moved toward the non-lifting side edge S2 at a predetermined speed. Then, the squeegee 23 is moved while sliding on the mesh screen 35. As a result, the ink passes through a non-masking portion of the mesh screen 35 and adheres to the surface of the printing material SB. At that time, by carrying out the optimum lifting motion based on a selected datum (for example, D5), the lifting motion may be coordinated with the squeegeeing motion to ensure separation of the screen 32 from the printing material SB.

In the scraping step after completion of the printing step, the positions of the squeegee 23 and the scraper 22 are switched, and only the scraper 22 is brought into contact with the screen 32. By driving the AC servo motor 14, the movable printer 21 is horizontally moved toward the lifting side edge S1. As a result, the residual ink on the mesh screen 35 is scraped backward by the scraper 22.

The characteristic effects of the embodiment of the present invention are listed below.

(1) In the screen printing machine 1 of the embodiment of the present invention, the AC servo motors 14 and 43 constituting the first and second driving mechanisms are controlled by the CPU as the interlocking controller. Thus, by optimizing the timing of the squeegeeing motion and the screen separating motion and the like, slackening of the screen 32 can be minimized to form coating films having uniform thickness and improve pattern forming accuracy. Also, in the screen printing machine 1, it is not necessary for an operator to make adjustment of the two AC servo motors 14 and 43 independently on his own in order that the lifting speed of the screen 32 is set depending on change in the moving speed the squeegee 23 and the like. Thus, the screen printing machine 1 is different from conventional apparatuses in which it is necessary for an operator to make adjustment of these two driving mechanisms independently on his own, and has an advantage that intricate and difficult procedures for adjustment are not required.

(2) In the screen printing machine 1, the CPU controls the motors 14 and 43 based on a plurality of the moving speed changing pattern data D1 to D4 and a plurality of the lifting speed changing pattern data D5 to D8 which have previously been held in the memory. Therefore, optimization can be easily and securely achieved as compared with a controlling system in which the optimum lifting movement changing pattern is prepared based on a moving speed changing pattern at that time.

(3) According to the embodiment of the present invention in which the variable fulcrum position mechanism 61 is provided, the position of the fulcrum P at the time of the lifting motion is easily set at the optimum position described above by changing the positions of the sliding blocks 71 of the engaging plates 65 and 66. Therefore, slackening of the screen 32 can be minimized without making adjustment of a screen separating amount, and the forming accuracy of a pattern is also improved. Further, difficult and intricate procedures for adjusting a screen separating amount are not required to indirectly improve productivity.

Although only one embodiment of the present invention has been described herein, it should be apparent to those skilled in the art that the present invention may be embodied in many other specific forms without departing from the spirit or scope of the invention. For example, the present invention may be embodied as follows:

(1) As the first and second driving mechanisms, highly accurate motors other than the AC servo motors 14 and 43 may be utilized, and mechanisms other than motors, for example, actuators such as air cylinders and the like may be utilized.

(2) The memory in the CPU as the interlocking controller may not necessarily hold both of the moving speed changing pattern data D1 to D4 and the lifting movement changing pattern data D5 to D8, and may have either of them.

(3) The memory in the CPU as the interlocking controller may not necessarily hold both of the moving speed changing pattern data D1 to D4 and the lifting movement changing pattern data D5 to D8. When the memory does not have both of the data, the CPU may recognize a moving speed changing pattern at that time, prepare the optimum lifting movement changing pattern based on the recognition and control the motors 14 and 43 in interlocking with each other.

(4) In addition to the two AC servo motors 14 and 43, the AC servo motor 24 as the driving mechanism for elevating and lowering the squeegee 23 may be further controlled in interlocking therewith. By controlling the AC servo motor 24 in interlocking therewith, screen separation can be achieved more securely.

The technical term used in the present specification is defined as described below.

The printing material includes glass substrates for fabricating printed wiring boards, resin substrates, insulating plate materials such as ceramics substrates and the like, common papers, leathers and metal plates, and so on.

Therefore, the present examples and embodiments are to be considered as illustrative and not restrictive, and the invention is not to be limited to the details given herein, but may be modified within the scope of the appended claims.

What is claimed is:

1. A screen printing machine including a screen that has a first edge and a second edge opposite to the first edge, and a squeegee, said machine further comprising:

first driving means for driving the squeegee movably arranged above the screen along an upper surface of the screen;

second driving means for separating the screen from a printing material by an upward rotation of said first edge around the second edge; and control means for controlling said first driving means and said second driving means to operate in association with each other, said control means having a memory for storing a plurality of driving speed changing patterns and a plurality of separating speed changing patterns, said control means controlling the first driving means using a selected driving speed changing pattern and controlling the second driving means using a selected separating speed changing patterns said control means selecting one of the plurality of driving speed changing patterns for controlling the first driving means and a corresponding optimum one of the plurality of separating speed changing patterns for controlling the second driving means.

2. The printing machine according to claim 1, wherein the control means controls the first driving means and the second driving means so that a change in the speed of separating the screen by the second driving means is coordinated with a change in the speed of driving the squeegee by the first driving means.

3. The screen printing machine according to claim 1 further comprising an auxiliary frame having a side, wherein the second driving means includes a motor, and a mechanism for converting the rotary motion of the motor into linear motion and a connecting shaft for connecting the first side of the screen to the side of the auxiliary frame.

4. The printing machine according to claim 1, wherein the control means includes a central processing unit (CPU).

5. The printing machine according to claim 4, wherein stores a number of driving speed changing patterns and a number of separating speed changing the CPU controls the first driving means and the second driving means by selecting an optimum combination of the driving speed changing patterns and separating speed changing patterns which have previously been stored in the memory.

6. The printing machine according to claim 4, wherein the memory stores at least two data groups, said at least two data groups including a first data group including data representing driving speed changing pattern data and a second data group including data representing separating, movement changing pattern data.

7. The printing machine according to claim 4, wherein the memory stores driving speed changing pattern data and separating movement changing pattern data.

8. The printing machine according to claim 4, wherein the CPU observes a driving speed changing pattern, and the CPU identifies an optimum separating movement changing pattern based on the driving speed changing patterned observed.

9. The printing machine according to claim 1, further comprising a mechanism for varying a fulcrum shaft position at the second edge of the screen.

10. The screen printing machine according to claim 1, wherein the first driving means has a motor and a ball screw.

11. The screen printing machine according to claim 10, wherein the motor is an AC servo motor.

* * * * *

UNITED STATES PATENT AND TRADEMARK OFFICE
CERTIFICATE OF CORRECTION

PATENT NO. : 5,894,793
DATED : April 20, 1999
INVENTOR(S) : Sakai

It is certified that error appears in the above-identified patent and that said Letters Patent is hereby corrected as shown below:

Column 10, line 5, change "patterns" to --pattern,--.

Column 10, line 27, delete "stores a number of driving speed changing patterns and a number of separating speed changing".

Column 10, line 37, change "separating," to --separating--.

Signed and Sealed this

Thirty-first Day of August, 1999

Attest:

Q. TODD DICKINSON

Attesting Officer

Acting Commissioner of Patents and Trademarks